United States Patent Office 3,799,890
Patented Mar. 26, 1974

3,799,890

COMPOSITION AND METHOD OF BONDING GOLD TO A CERAMIC SUBSTRATE AND A BONDED GOLD ARTICLE

Baynard R. Smith, 701 Lakeside Drive, North Palm Beach, Fla. 33408

No Drawing. Filed Mar. 8, 1972, Ser. No. 232,943
Int. Cl. H01b *1/02, 1/06*
U.S. Cl. 252—514 11 Claims

ABSTRACT OF THE DISCLOSURE

A composition for, as well as a method of bonding gold to a ceramic and a bonded gold article which includes a composition of gold and copper oxide for bonding a gold layer to a ceramic substrate. Gold powder and copper oxide particles define a solid composition mixture wherein the copper oxide has a weight percentage in the preferred region between 1.2% and 1.4%. Organic binder is added to a predetermined amount of copper oxide particles and blended. The gold powder is incorporated into the copper oxide and organic binder to form a total composition mixture. The organic binder has a weight percentage of the total composition mixture wtihin the preferred range of 50% to 85%. The total composition mixture is blended and applied to a ceramic substrate. The coated ceramic article is fired within the preferred temperature range 1020° C. to 1040° C. Copper oxide crystals are formed which impregnate the ceramic substrate and form a high strength bond between the gold layer and the ceramic substrate.

BACKGROUND OF THE INVENTION

Field of the invention

This invention pertains to compositions and methods for bonding gold to ceramic substrates. In particular this invention relates to the field of bonding gold to ceramic substrates using a copper oxide composition as the major bonding agent. More in particular, this invention pertains to the field of ceramic articles of manufacture having a gold layer bonded thereto.

Prior art

Compositions, and methods for bonding gold to ceramic substrates are known in the art. In addition, ceramic articles of manufacture are known which have a gold layer adhered thereto. However, in general, the mechanics of the bonding of gold to ceramic material has included the addition of a predetermined percentage of glass frits into the gold. The glass frits are usually incorporated in an organic binder and mixed or blended with gold powder prior to the application to the ceramic substrate. The composition (including the gold, the organic binder, and ceramic article) is heated to a temperature approaching the melting temperature of the glass. The glass frits then essentially wet the base ceramic surface and the gold and serve as a bonding agent.

In the prior art, where gold or gold alloys are mixed with organic binders containing glass frits, it has been found that an acceptable bond strength is attained when the glass frit by weight percentage of the total composition reaches 20%. However, the electrical resistivity of such compositions may be as high as 0.03 ohm/square mil. Since a major use of such bonds is in the production of circuit boards, the high electrical resistivity is a distinct disadvantage.

When the glass frit weight percentage is diminished to approximately 2%, a lower electrical resistivity of the coating is achieved. However, the low percentage of glass frits leads to a low bonding strength, and the coating is easily removeable. In practice, a tradeoff study is usually used where a low percentage of glass frits with a low bonding strength is traded off against a high percentage of glass frits having a high electrical resistivity. Very often, prior techniques and compositions call for a glass frit composition approaching a weight percentage of 10%. The electrical resistivity formed in the coating layer of the present invention is approximately the same as pure gold within 2% to 3%. This resistivity is substantially lower than the prior art glass frit bonded gold.

Ceramic substrate gold coatings are generally manufactured having a thickness range between 200 millionths and 1000 millionths of an inch. This thickness range is necessary in order that a sufficient amount of glass be present in the composition in order to effect an acceptable bond. In the instant invention, where no glass or inorganic binder is used, the gold coating or layer on the ceramic substrate may be reduced to 50 millionths of an inch while maintaining an acceptable bonding action. Where glass frits are used it is evident that the cost of manufacture of coated ceramic substrates must by necessity go up while at the same time inefficiently using a natural resource.

Where glass frits or other known bonds are used, the thermal conductivity of the gold layer has been found to be low. This disadvantage has the effect of producing unwanted thermal gradients between the ceramic substrate and any mounted circuitry. In the present invention where the only constituents of the bonded layer is copper oxide crystals and gold, the overall density of the layer approximates that of gold and further has a thermal conductivity approaching that of the pure gold.

In hybrid circuits, in some prior cases, it has been found that the glass frits contained in the gold were not compatible with glass frits in the printed resistors. This condition possibly causes formation of bubbles and voids between mating surfaces. From this, inaccurate readings and stresses may be built up to change the electrical characteristics of the aforementioned resistors. In the instant invention, the gold coating remains relatively inert with respect to electrical parameters.

In other prior art such as Pat. No. 3,450,545 the bonded layer includes between 4% and 35% inorganic powder which may be a glass type frit. Where any sizeable percentage of glass type frit/inorganic binder powder is used, then the density of the gold necessarily decreases.

Other prior art, such as that shown in Pat. No. 2,733,-167 does bond gold to a non-porous ceramic surface for various decorative purposes. However, such bonding of gold uses organic compounds of copper and do not begin with a copper oxide as in the present invention. Such prior art provides and utilizes a glazed ceramic surface or glass base to provide a coating which is only a few millionths of an inch in thickness. Such small thicknesses of gold bonding are easily removeable and not applicable to the thicknesses needed in the bonding of integrated or hybrid circuitry.

Still other prior art, such as Pats. No. 3,403,043 and No. 3,429,736 provide refractory powders for ceramic bonding such as tungsten or molybdenum which must be fired in a reducing atmosphere. Where such refractory powders are fired in the air, as in the instant invention, the compounds would oxidize and there would no longer be a metal layer on the ceramic substrate.

SUMMARY OF THE INVENTION

A metalizing composition which comprises an intimate mixture on a weight basis of: (A) about 0.1% to 7.0%, preferably 1.2% to 1.4%, of at least one copper oxide powder from the group consisting of cuprous oxide and cupric oxide; (B) 93% to 99.9%, preferably 98.6% to 98.8% of gold powder, the copper oxide powder and the gold powder defining in combination a solid composition mixture where the weight percentages of the copper oxide and the gold powder pertain to the solid composition mixture; and, (C) about 10% to 90%, preferably 50% to 85% of an organic binder devoid of glass frits, where the organic bnder in combination with the copper oxide powder and the gold powder defines a total composition mixture and the weight percentage of the organic binder pertains to the total composition mixture.

DESCRIPTION OF THE PREFERRED EMBODIMENTS

According to the present invention there is provided a composition and method for bonding gold to an alumina or ceramic substrate. Additionally, and in accordance with the composition and method invention, there is included an article of manufacture invention presenting a ceramic substrate having a gold and copper oxide layer bonded thereto. All embodiments of the invention as herein described pertain to the bonding of gold to a ceramic or alumina substrate. One major use for this invention lies in the field of integrated circuits wherein semi-conductor devices or chips are bonded to various ceramic substrates. Another major use for this invention lies in the field of hybrid circuitry wherein semi-conductor devices are bonded to various conductive portions of the circuits of the aforesaid ceramic substrates. The ceramic substrates are in general composed primarily of alumina and beryllium oxide.

The method and composition for bonding gold to a ceramic substrate provides a thin coating of gold on the ceramic substrate which is not easily removable. Further, the composition, as will be described permits the final coated ceramic layer to have a high thermal conductivity coupled with a low electrical resistivity. The final coating, in addition, has a density substantially equivalent to gold and the bond is found to be insensitive to repeated thermal processing such as subjecting the bonded ceramic substrate to consecutive temperature cycling within ranges exceeding several hundred degrees.

The metalizing or bonding compositions of the invention comprise intimate mixtures, on a weight percentage basis, of: (A) 0.1% to 7.0%, preferably 1.2% to 1.4% of at least one copper oxide additive in powder form from the group consisting of cuprous oxide and cupric oxide; (B) 93.0% to 99.9%, preferably 98.6% to 98.8% of gold powder, the weight percentages of copper oxide and gold powder defining the weight percentages of a solid mixture composition with the weight percentages of the copper oxide and gold powder summing to substantially 100%; and (C) 10.0% to 95%, preferably 15% to 50%, of an organic binder devoid of glass frits, the weight percentages of the organic binder defining the weight percentages of a total mixture composition including the copper oxide, gold powder, and organic binder in combination.

The incorporation of the organic binder, component (C) has been found to significantly improve the quality of bonding gold to ceramic substrates when coatings of the compositions are fired on the aforementioned ceramic substrates. The absence of glass frits in component (C) permits direct interaction of component (A) in combination with component (B), to the ceramic substrate. The resulting bond achieved relies basically on the copper oxide, component (A), being the adhesive mechanism between the gold, component (B), and the ceramic substrate. The inventive compositions as herein described constitute a preferred group of bonding or metalizing compositions since they provide bonding layers having high joint or tensile loading strength for layered thicknesses ranging from 50 millionths to .002 inch. Additionally, the electrical resistance of the bond constituting the invention is substantially less than gold pastes containing glass frits. Where glass frits are utilized in the bonding composition, electrical resistivites ranging from 0.0015 to 0.030 ohm/square/mil have been observed. The present composition provides an electrical resistivity in the order of 0.001 ohm/square mil or less which reduces electric power loss when this composition is used in the construction of circuitry. Further, low thermal gradients occur between the substrate and components attached to the bonded layer since both components (A) and (B) have extremely high thermal conductivities in the ranges of 224.0 and 169.0 B.t.u./hr./sq. ft./deg. F. respectively as opposed to the thermal conductivity of glass frits in the order of 0.59 B.t.u./hr./sq. ft./deg. F. The most preferred compositions of the invention are those in which the metal components defining the solid composition mixture consist essentially of from 1.2% to 1.4% of copper oxide and 98.6% to 98.8% of gold, all of the percentages referring to weight percentages.

As is the usual case for bonds or metallizing compositions of this nature, they are usually applied to a ceramic substrate through silk screening, printing, brushing or some like technique. The application is generally performed in an ambient air environment at a temperature approximating normal room conditions (i.e. 22° C.), although such is not critical to the inventive concept. The coated substrate is fired in an oven between the temperature ranges of 900° C. and 1063° C., with a preferred temperature firing range between 1020° C. and 1040° C. The coated ceramic substrate is maintained in the oven in an oxidizing atmosphere, until the substrate reaches substantial thermal equilibrium with the surrounding high temperature atmosphere.

The copper oxide particles (cuprous oxide or cupric oxide) utilized in the composition are generally milled or ground to a dimensional size less than one micron in length. The gold powder which is commercially bought has an initial size in the range between 2 and 5 microns.

The method invention for producing a thin, high thermally conductive, low electrically resistive bonding layer on a ceramic substrate is detailed in the following paragraphs.

Copper oxide (cupric oxide, cuprous oxide) particles or particulates are incorporated into toluol, benzene, alcohol, acetone or some like composition to form a conglomerate mixture. The mixture is ball milled or passed through some like technique for a time approximating the range between 2 and 24 hours. This step breaks down the copper oxide particulates to a fine powder preferably in the sub-micron dimensional size. The time of milling is not critical to the inventive concept as herein defined but such milling or grinding techniques are maintained until the particulates have substantially reached the fine powder texture desired.

The conglomerate mixture is then dried in a standard oven until the copper oxide powder is substantially devoid of volatile material. In practice the oven has been maintained at a temperature of approximately 100° C., between 1 and 5 hours dependent on the weight of conglomerate mixture being dried. The oven or other drying mechanism temperature and time of drying for this step is not critical to the inventive concept with the only restriction placed on these parameters being that upon termination of this drying step, that the remaining copper oxide (cupric oxide, cuprous oxide) powder be substantially free of the volatile material used in forming the conglomerate mixture (i.e. toluol, benzene, alcohol, acetone or like composition) as previously described.

The resulting dry copper oxide (cupric oxide or cuprous oxide) is blended into a commercially available organic binder in predetermined weight percentages. The blending step is accomplished in a standard paint mill (wet grinder), tumbler or some like mechanism. The blending in this manner disperses the copper oxide powder and substantially breaks up possibly existing agglomerates. The copper oxide blended into the organic binder has a weight percentage range of between 0.1% and 7.0% of the solid composition mixture comprising the copper oxide (cupric oxide or cuprous oxide) and gold powder with a preferred range extending between 1.2% and 1.4%.

The organic binder utilized in this step has a weight percentage range between 10% and 95% of the total mixture composition comprising the copper oxide, gold powder, and organic binder. In this phase of the process step organic binders such as beta teripinol, ethyl cellulose mixture, pine oil, methyl cellulose or like compositions may be used. In actual practice, commercially available organic binders have been used including, Ferro Vehicle Corp. binder H–216, Alpha Metals Corp. binder Reliafilm No. 5181 and L. Reusche and Co. binder Medium No. 163–C.

The blending of the copper oxide (cuprous oxide or cupric oxide) with the organic binder forms an intermediate mixture having weight percentages within ranges previously defined. The gold powder is then mixed into the intermediate mixture of copper oxide and organic binder. The weight percentage of the gold powder as a function of the solid composition mixture herein defined has a range between 99.9% and 93% with a preferred range between 98.6% and 98.8%. The inclusion of the gold powder into the intermediate mixture forms the total mixture composition comprising the gold powder, copper oxide, and organic binder. This mixing step is accomplished in a wet grinder, wet three roll grinder, paint mill mechanism, or other commercially available mixing mechanisms well known in the art. In this step the copper oxide particles are evenly disbursed into the surrounding gold powder. The solid particles are preferably wetted in an even manner and a substantially homogeneous blend is formed of the total mixture composition.

The total mixture composition is applied to a ceramic substrate through silk screening, printing, brushing, hand dipping, or another number of methods not important to the inventive concept as herein detailed. The application of the total mixture composition to the ceramic substrate is accomplished preferably in an ambient atmosphere condition, however such is not important to the invention. In this manner, there is attained a ceramic substrate coated with a total composition mixture.

The coated ceramic substrate is then introduced into an oven or other heating mechanism. The coated substrate is brought to temperature equilibrium conditions within a range between 900° C. and 1063° C. having a preferred temperature range between 1020° C. and 1040° C. In this manner, the coated ceramic substrate is fired and results in a coating thickness of application ranging between 50 millionths and .002 inch. The time of firing the coated ceramic substrate is not critical to the invention with the important criteria being that the coated substrate attain thermal equilibrium with the surrounding environment within the heating mechanism at the prescribed temperature ranges as herein described.

During the firing step, substantially all of the organic binder is driven off into the surrounding environment with possibly only a residual amount left in the coating. It has been observed that portions of the copper oxide particles impregnate the alumina or ceramic substrate. In the manner as described, a highly force resistant bond is formed between the gold and copper oxide coating and the ceramic substrate. The resulting bond forms a relatively low electrically resistive coating, additionally having a relatively high thermal conductance.

The method invention as herein described has enumerated a number of procedural steps. In summary, these steps in consecutive order include milling or grinding copper oxide particulates (cupric oxide or cuprous oxide) in combination with a medium such as toluol, benzene or like composition. The copper oxide is then dried to remove any contained volatiles. The copper oxide is then mixed with predetermined weight percentages of an organic binder to form the previously defined intermediate mixture. Gold powder in previously defined weight percentage ranges is added to the intermediate mixture to form the total mixture composition. The total mixture composition is mixed to form a homogeneous blend and applied to an alumina or ceramic substrate. The coated substrate is fired at a particular temperature within previously defined temperature ranges to form the ceramic substrate bond.

It is to be understood that the method steps as herein described may be taken out of consecutive order in a manner so as to produce substantially the same bonding mechanism. In an embodiment of the invention, it is apparant to those skilled in the art that initially predetermined quantities (in the ranges previously defined) of gold powder, copper oxide particulates (cuprous oxide or cupric oxide) and organic binder may be weighed and segregated from each other. The copper oxide particles are then reduced in dimensional size, preferably to a size wherein the longest dimension is below 1 micron in length. This may be accomplished through ball milling or some equivalent technique. Where the copper oxide has been mixed with a medium such as toluol, benzene or like composition, the volatiles are removed in a heated oven.

In diverging from the preferred method embodiment in practice but not in scope or skill, the dried copper oxide and gold powder may be blended in the dry state by tumbling, mixing or some like mechanism. This blending step forms a relatively coarse mixture of gold powder and copper oxide in the previously described percentage ranges. Organic binders which are commercially available may then be mixed into the gold and copper oxide composition having a weight percentage of the total mixture composition ranging between 10% and 95%. The total mixture composition may then be incorporated into a wet grinder, wet three rolled grinder, paint mill mechanism or other like mechanism for evenly wetting all solid particles and forming a substantially homogeneous blend. The purpose of this step being to evenly disburse the copper oxide into the surrounding gold particles. The resulting composition is applied to an alumina or ceramic substrate through silk screening, printing, brushing or other equivalent methods. The coated substrate is fired in an oven at a particular temperature within the ranges of 900° C. and 1063° C. The substrate is cooled to ambient conditions and a strong gold bonding is observed to adhere to the substrate.

The composition and method of production as herein detailed results in a ceramic article of manufacture. According to the present invention there is provided a ceramic article having a fired coating wherein the fired coating includes a mixture of gold and copper oxide. The ceramic fired coating mixture has a preferred thickness range between 50 millionths and .002 inch. Firing temperatures for the coating range between 900° C. and 1063° C. with a preferred temperature range between 1020° C. and 1040° C.

Gold powder, copper oxide (cuprous oxide or cupric oxide), and a commercially available organic binder (devoid of glass frits) are mixed together to form a total composition mixture. The weight percentage of the organic binder to the total composition mixture has a range between 10% and 95% with a preferred range between 15% and 50%. The gold powder and copper oxide in particle form, comprise a solid composition mixture. The weight percentage of the copper oxide to the solid composition mixture has a range between 0.1% and 7% with a preferred range between 1.2 and 1.4. The gold powder having a micron size between 2 and 5 has a weight percentage of the solid composition mixture between the range of 93% and 99.9% with a preferred range between 98.6% and 98.8%.

The total composition mixture is applied to a ceramic substrate in thicknesses ranging from 50 millionths to .002 inch. The application of the coating is made through, hand dipping, silk screening, or other like techniques previously described. The ceramic substrate with the layer comprising the total comprosition mixture is then fired within an oven between 900° C. and 1063° C., with a preferred temperature firing range between 1020° C. and 1040° C.

The resulting ceramic article produced provides a ceramic substrate having a strong gold bonded layer with a layer thickness as low as 50 millionths of an inch in thickness. The organic binder is substantially burned off in the firing step. The observed basic bonding mechanism is seen to possibly arise from the growth of crystals of the initially disposed copper oxide and the possible alloying of gold and copper oxide, which impregnate the ceramic to form a strong bond between the ceramic and the gold outer layer.

The following examples illustrate the use of copper oxide contained within a gold powder to form a superior bond between a gold layer on a ceramic or alumina substrate. Each of the examples set forth the basic formulations of the metalizing compositions of the invention. In each of the examples the copper oxide used was both cuprous oxide and cupric oxide. Therefore, for each example, two test runs were made, one for cuprous oxide, and one for cupric oxide, all other parameters were held constant. In all example cases for the cupric and cuprous oxide runs, the bonding results were substantially identical. The copper oxide (cuprous oxide or cupric oxide) used was milled in order that the individual particulates were dimensionally in the micron range. The gold powder, of commercial stock, had a micron range between 2 and 5. The organic binder used in each of the examples was commercially purchased in accordance with the brands previously described.

The weight percentages defined in each of the examples for the copper oxide and gold powder refers to the percentage weight of the solid composition mixture comprising the gold powder and the copper oxide. The weight percentage of the organic binder refers to the weight percentage of the total mixture composition comprising the copper oxide, the gold powder, and the organic binder. The basic parameters varied for the examples included firing temperature, and weight percentages of copper oxide, gold powder, and organic binder.

EXAMPLE 1

| | Wt. percent |
|---|---|
| Copper oxide (percent solid composition) | 0.1 |
| Gold powder (percent solid composition) | 99.9 |
| Organic binder (percent total composition) | 10.0 |

The copper oxide was blended with the gold powder and the organic binder as previously disclosed. The total composition mixture was applied to a ceramic substrate. The coated substrate was fired at a temperature of 900° C. until thermal equilibrium was achieved. A poor bond was found to be formed. Particles of gold were visible and a portion were easily removable. Low crystalline growth was observed, however some bonding was found to take place between the gold and ceramic substrate.

EXAMPLE 2

| | Percent |
|---|---|
| Copper oxide (percent solid composition) | 0.1 |
| Gold powder (percent solid composition) | 99.9 |
| Organic binder (percent total composition) | 10.0 |

The gold powder, copper oxide, and organic binder were blended as previously disclosed and the total composition mixture was applied to a ceramic substrate. The coated substrate was fired at a temperature approximating 1063° C. A poor bond was found to be formed with discontinuous areas of adhesion. The gold was found to melt and substantially low crystalline growth was observed, however some bonding of the gold to the substrate was seen to take place.

EXAMPLE 3

| | Percent |
|---|---|
| Copper oxide (percent solid composition) | 0.1 |
| Gold powder (percent solid composition) | 99.9 |
| Organic binder (percent total composition) | 95.0 |

The gold powder, copper oxide (as in all examples this was run for both cuprous oxide and cupric oxide), and organic binder were blended and the total composition mixture was applied to a ceramic substrate. The coated substrate was placed in an oven and brought to thermal equilibrium or fired at a temperature approximating 900° C. Some bonding of the gold to the ceramic substrate was seen to take place, however, the bond was classified as poor. Discrete areas of adhesion was found but due to low amount of copper oxide in combination with the low firing temperature there was little crystalline growth observed.

EXAMPLE 4

| | Percent |
|---|---|
| Copper oxide (percent solid composition) | 0.1 |
| Gold powder (percent solid composition) | 99.9 |
| Organic binder (percent total composition) | 95 |

The total composition mixture comprising stated weight percentages of copper oxide, gold powder, and organic binder was prepared in the disclosed technique and applied to a ceramic substrate. In this example, the coated ceramic was fired at a temperature of 1063° C. Resulting bond showed negligible crystalline growth and classified in the poor category. Gold was seen to have melted in particular areas. Some adhesion was noted creating a marginally useful bond.

EXAMPLE 5

| | Percent |
|---|---|
| Copper oxide (percent solid composition) | 7 |
| Gold powder (percent solid composition) | 93 |
| Organic binder (percent total composition) | 10 |

The total composition mixture comprising the above listed weight percentages of copper oxide (as always two runs were made, one each for cuprous oxide and cupric oxide), gold powder, and organic binder were prepared in accordance with the disclosed technique and applied to a ceramic substrate. The coated substrate was fired at a temperature approximating 900° C. Upon the usual cooling, the bonded substrate was observed to have very low crystalline growth. Particles of copper oxide were observed and partial bonding was attained, however such bond was classified to be within the poor range. A portion of the coating (particularly the discrete particles) was easily removable.

EXAMPLE 6

| | Percent |
|---|---|
| Copper oxide (percent solid composition) | 7 |
| Gold powder (percent solid composition) | 93 |
| Organic binder (percent total composition) | 10 |

The copper oxide was blended with the gold powder and the organic binder as previously disclosed. The total composition mixture was applied to a ceramic substrate and fired at 1063° C. The coated substrate was maintained within the oven during the firing process until the substrate achieved the surrounding environmental temperature upon cooling it was noted that a portion of the gold had melted. Particles of copper oxide were noted and the coating appeared to have beads encased therein. Some bonding was achieved, however such was classified as a poor bond since the surface properties were found to be non-homogeneous.

EXAMPLE 7

| | Percent |
|---|---|
| Copper oxide (percent solid composition) | 7 |
| Gold powder (percent solid composition) | 93 |
| Organic binder (percent total composition) | 95 |

A blend of the listed constituents was applied to a ceramic substrate. As in all examples, the blend defining the total composition mixture, was produced in accordance with the disclosed technique. The ceramic substrate in this example was fired at 900° C. Partial bonding was found to occur with a low crystalline growth observed. Discrete particles of copper oxide were seen with the bond being classified in a range between poor and fair.

EXAMPLE 8

| | Percent |
|---|---|
| Copper oxide (percent solid composition) | 7 |
| Gold powder (percent solid composition) | 93 |
| Organic binder (percent total composition) | 95 |

The exact same blend was used in this example as was used in Example 7 to form the total composition mixture. All techniques in preparation were under identical conditions, however, the coated ceramic substrate was fired at 1063° C. Molten beads of gold were observed with a distinctly non-homogeneous texture visible after the substrate had cooled. The resulting bond was found to be partially effective but classified in the poor range.

EXAMPLE 9

| | Percent |
|---|---|
| Copper oxide (percent solid composition) | 1.2 |
| Gold powder (percent solid composition) | 98.8 |
| Organic binder (percent total composition) | 50 |

Copper oxide (cuprous oxide and cupric oxide) particles, gold powder, and organic binder were measured in the weight percentages shown above. The copper oxide was mixed with tolvol and ball milled for 2 hours to reduce the particle size into the sub-micron range. The copper oxide was fired in an oven and blended into the commercially available organic binder. The gold powder was mixed into the copper oxide and organic binder to form the total composition mixture. This mixture was then mixed in order to form a homogeneous composition and applied to a ceramic substrate. The coated substrate was fired in an oven at 1035° C. The resulting bond formed was bright metallic in finish and formed an excellent bond. The bond strength was found to be very high and not easily removeable. Crystalline growth was observed with the copper oxide seen to impregnate the ceramic substrate. This example produced a uniform, homogeneous coating which had a high thermal conductivity coupled with a low electrical resistivity. The bond was classified as excellent relative to the properties herein described.

EXAMPLE 10

| | Percent |
|---|---|
| Copper oxide (percent solid composition) | 1.2 |
| Gold powder (percent solid composition) | 98.8 |
| Organic binder (percent total composition) | 50 |

The copper oxide, gold powder, and organic binder were blended in the same manner as that shown in Example 10. The total composition mixture was applied to a ceramic substrate. The coated ceramic substrate was incorporated into an oven maintained at 1020° C. As was the case in all other examples, the substrate was permitted to attain thermal equilibrium with the oven atmosphere and then cooled down. The resulting bond was bright metallic in surface finish. Crystalline growth was observed with the ceramic substrate being impregnated by the crystals to form an excellent bond. Thermal and electrical properties of this bond were found to be similar to those found in Example 9. Tensile strength of the bond was again found to be extremely high with separation only occuring with destruction of the substrate surface.

EXAMPLE 11

| | Percent |
|---|---|
| Copper oxide (percent solid composition) | 1.4 |
| Gold powder (percent solid composition) | 98.6 |
| Organic binder (percent total composition) | 15 |

The copper oxide particles or powder, having submicron dimensional sizes, was blended with the gold powder and organic binder in the weight percentages as enumerated above. The copper oxide weight percentage was raised to 1.4% of the solid composition mixture and the organic binder was lowered to 15% by weight of the total composition mixture. The specific constituents were blended or mixed together in the manner as previously disclosed. The total composition mixture was applied to a ceramic substrate and fired at 1035° C. Upon cooling, the bond was found to be excellent having a high tensile loading strength. The resultant coating was bright metallic in finish and showed excellent crystalline growth of the copper oxide. Efforts to remove the bonded layer resulted in destruction of the ceramic substrate. Crystalline impregnation of the ceramic layer was clearly visible at thicknesses ranging between 50 millionths to .002 of an inch.

EXAMPLE 12

| | Percent |
|---|---|
| Copper oxide (percent solid composition) | 1.4 |
| Gold powder (percent solid composition) | 98.6 |
| Organic binder (percent total composition) | 15 |

The total composition mixture was prepared in a manner similar to the other examples. The weight percentages of the constituents was the same as that shown in Example 11, however the coated ceramic substrate was fired at 1020° C. The resulting bond was found to be similar to that of the previous example. Crystalline growth was observed and impregnation into the ceramic seemed to be the basic bonding mechanism. A bright, homogeneous metallic coating was observed and the bond adherence was extremely high. The bond was classified as excellent for thickness between 50 millionths and .002 of an inch.

EXAMPLE 13

| | Percent |
|---|---|
| Copper oxide (percent solid composition) | 0.5 |
| Gold powder (percent solid composition) | 99.5 |
| Organic binder (percent total composition) | 20 |

The total composition mixture comprising the copper oxide particles (remembering as in all examples, two separate runs were made with cuprous oxide and cupric oxide), the gold powder and the organic binder were blended. The total composition was applied to a ceramic substrate and fired at 1055° C. The resulting bond maintained a bright metallic finish with good bonding properties. However, due to the lower weight percentage of copper oxide used, less crystalline growth was observed than was found in Examples 9 through 12. Bond was classified as good, but the layer could be chipped away (at certain areas) when the layer thickness approached 50 millionths of an inch.

EXAMPLE 14

| | Percent |
|---|---|
| Copper oxide (percent solid composition) | 3.0 |
| Gold powder (percent solid composition) | 97.0 |
| Organic binder (percent total composition) | 20 |

The total composition mixture was blended with an excess of copper oxide particles (with respect to the 1.2% to 1.4% preferred range). After application to the ceramic substrate, the entire article was fired at a temperature of 1020° C. The resultant bond showed a dull finish from the initial excess inclusion of copper oxide. Crystalline growth was observed to be high with bonding held at high strength.

As disclosed, there has been shown a method and composition for bonding gold to a ceramic substrate resulting in a ceramic article of manufacture having unique and desirable qualities. The blending of gold powder with copper oxide particles (cuprous oxide or cupric oxide) in predetermined weight percentage ranges and formed in combination with an organic binder devoid of glass frits permits a high strength bond of gold to the ceramic substrate. Due to the non-existence of the glass frit, the ceramic layer may be applied in thicknesses approximating 50 millionths of an inch while maintaining excellent bonding characteristics. Additionally, the thermal conductivity was found to be high, thereby lowering thermal gradients throughout the ceramic article. Electrical resistivity of the coating was found to be lower than that achieved when glass frits are the main bonding mechanism.

It is to be understood that the foregoing description including the specific examples of this invention is made by way of example only and is not to be considered as a limitation of its scope.

What is claimed is:

1. A metalizing composition consisting of an intimate mixture, on a weight basis, of: (A) about .1% to 7.0% of at least one copper oxide powder from the group consisting of cuprous oxide and cupric oxide; (B) 93% to 99.9% of gold powder, said copper oxide powder and said gold powder defining in combination a solid composition mixture, said weight percentages of said copper oxide and said gold powder pertaining to said solid composition mixture; and (C) about 10% to 90% of an organic binder devoid of glass frits, said organic binder in combination with said copper oxide powder and said gold powder defining a total composition mixture, said weight percentage of said organic binder pertaining to said total composition mixture.

2. The metalizing composition as recited in claim 1 wherein composition (A) is cuprous oxide.

3. The metalizing composition as recited in claim 2 wherein said weight percentage of said cuprous oxide is within the range between 1.0% and 1.5% of said solid composition mixture.

4. The metalizing composition as recited in claim 3 wherein said weight percentage of said organic binder is within the range between 15% and 50% of said total composition mixture.

5. The metalizing composition as recited in claim 2 wherein said weight percentage of said cuprous oxide is within the range between 1.2% and 1.4% of said total composition mixture.

6. The metalizing composition as recited in claim 5 wherein said weight percentage of said organic binder is within the range between 15% and 50% of said total composition mixture.

7. The metalizing composition as recited in claim 1 wherein composition (A) is cuprous oxide.

8. The metalizing composition as recited in claim 7 wherein said weight percentage of said cupric oxide is within the range between 1.0% and 1.5% of said solid composition mixture.

9. The metalizing composition as recited in claim 8 wherein said weight percentage of said organic binder is within the range between 15% and 50% of said total composition mixture.

10. The metalizing composition as recited in claim 7 wherein said weight percentage of said cupric oxide is within the range between 1.2% and 1.4% of said solid composition mixture.

11. The metalizing composition as recited in claim 10 wherein said weight percentage of said organic binder is within the range between 15% and 50% of said total composition mixture.

References Cited

UNITED STATES PATENTS

| | | | |
|---|---|---|---|
| 3,545,986 | 12/1970 | Short | 117—227 |
| 3,516,949 | 6/1970 | Hoffman | 252—514 |
| 3,440,182 | 4/1969 | Hoffman | 252—514 |
| 3,407,081 | 10/1968 | Ballard | 117—227 |
| 3,380,835 | 4/1968 | Short | 117—227 |
| 3,021,233 | 2/1962 | Fenity | 252—514 |

ALFRED L. LEAVITT, Primary Examiner

M. F. ESPOSITO, Assistant Examiner

U.S. Cl. X.R.

252—518

PO-1050
(5/69)

UNITED STATES PATENT OFFICE
CERTIFICATE OF CORRECTION

Patent No. 3,799,890 Dated March 26, 1974

Inventor(s) Baynard R. Smith

It is certified that error appears in the above-identified patent and that said Letters Patent are hereby corrected as shown below:

In the Specification, Column 1, Line 24 (Abstract, Line 12), change "wtihin" to --within--:

In the Claims, Column 11, Line 16 (Claim 1, Line 1), after "consisting", add --essentially--.
Column 12, Line 8 (Claim 7, Line 2), change "cuprous" to --cupric--.

Signed and sealed this 10th day of September 1974.

(SEAL)
Attest:

McCOY M. GIBSON, JR.
Attesting Officer

C. MARSHALL DANN
Commissioner of Patents